US008502642B2

(12) United States Patent
Vitito

(10) Patent No.: US 8,502,642 B2
(45) Date of Patent: Aug. 6, 2013

(54) SYSTEM FOR CONTROLLING THE USE OF ELECTRONIC DEVICES WITHIN AN AUTOMOBILE

(75) Inventor: Christopher J. Vitito, Celebration, FL (US)

(73) Assignee: Voxx International Corporation, Hauppauge, NY (US)

( * ) Notice: Subject to any disclaimer, the term of this patent is extended or adjusted under 35 U.S.C. 154(b) by 896 days.

(21) Appl. No.: 12/292,451

(22) Filed: Nov. 19, 2008

(65) Prior Publication Data

US 2009/0128286 A1 May 21, 2009

Related U.S. Application Data

(60) Provisional application No. 60/996,498, filed on Nov. 20, 2007.

(51) Int. Cl.
*G05B 19/00* (2006.01)

(52) U.S. Cl.
USPC ....... 340/5.21; 455/411; 455/410; 455/456.4; 701/1; 340/438; 340/439; 340/441

(58) Field of Classification Search
USPC ............... 340/5.21, 988, 990, 425.5, 426.11, 340/438, 439, 441; 455/379, 422, 426, 411, 455/456.4, 410; 701/300, 213, 342, 457, 701/1
See application file for complete search history.

(56) References Cited

U.S. PATENT DOCUMENTS

| | | | |
|---|---|---|---|
| 5,266,782 A | 11/1993 | Alanara et al. | |
| 5,444,764 A | 8/1995 | Galecki | |
| 5,452,288 A * | 9/1995 | Rahuel et al. | 370/203 |
| 5,566,224 A * | 10/1996 | ul Azam et al. | 455/566 |
| 5,714,930 A * | 2/1998 | McKinney, Jr. | 340/468 |
| 5,887,250 A | 3/1999 | Shah | |
| 5,929,752 A * | 7/1999 | Janky et al. | 340/426.2 |
| 6,124,799 A | 9/2000 | Parker | |
| 6,147,598 A * | 11/2000 | Murphy et al. | 340/426.19 |
| 6,225,897 B1 * | 5/2001 | Doyle et al. | 340/468 |
| 6,262,657 B1 * | 7/2001 | Okuda et al. | 340/439 |
| 6,289,314 B1 | 9/2001 | Matsuzaki et al. | |
| 6,353,778 B1 * | 3/2002 | Brown | 701/1 |
| 6,690,940 B1 | 2/2004 | Brown et al. | 455/456.4 |
| 6,697,638 B1 * | 2/2004 | Larsson et al. | 455/553.1 |
| 6,832,093 B1 * | 12/2004 | Ranta | 455/456.4 |
| 7,006,793 B2 * | 2/2006 | Himmel et al. | 455/41.1 |
| 7,050,755 B2 | 5/2006 | Kline | |
| 7,079,015 B2 * | 7/2006 | Gibeau | 340/425.5 |
| 7,123,874 B1 | 10/2006 | Brennan | |
| 7,466,216 B2 * | 12/2008 | Kawamura et al. | 340/5.23 |
| 7,505,784 B2 * | 3/2009 | Barbera | 455/557 |
| 7,538,722 B2 * | 5/2009 | Thandu et al. | 342/357.74 |
| 7,541,914 B2 * | 6/2009 | Breiner | 340/425.5 |

(Continued)

*Primary Examiner* — Jennifer Mehmood
*Assistant Examiner* — Rufus Point
(74) *Attorney, Agent, or Firm* — F. Chau & Associates, LLC

(57) ABSTRACT

A system for controlling the use of electronic devices within an automobile includes a control module integrated into the operation of the automobile, wherein the control module is linked to the electrical system of the automobile and is controlled, monitored and updated via a graphical user interface of the automobiles. The control module includes a mechanism for identifying use of electronic devices within the automobile, determining whether the usage is permitted and preventing usage of the electronic device if it is determined the usage is not permitted.

12 Claims, 2 Drawing Sheets

(56) References Cited

U.S. PATENT DOCUMENTS

| | | | |
|---|---|---|---|
| 7,697,917 B2* | 4/2010 | Camp et al. | 455/345 |
| 7,873,374 B1* | 1/2011 | O'Neil | 455/456.4 |
| 7,876,205 B2* | 1/2011 | Catten et al. | 340/439 |
| 7,924,139 B2* | 4/2011 | Sasakura et al. | 340/5.8 |
| 8,204,649 B2* | 6/2012 | Zhou et al. | 701/36 |
| 2003/0197599 A1* | 10/2003 | Kim | 340/425.5 |
| 2004/0077339 A1 | 4/2004 | Martens | |
| 2004/0176083 A1* | 9/2004 | Shiao et al. | 455/417 |
| 2004/0203601 A1* | 10/2004 | Morriss et al. | 455/411 |
| 2004/0264387 A1* | 12/2004 | Gibeau | 370/254 |
| 2005/0179518 A1* | 8/2005 | Kawamura et al. | 340/5.23 |
| 2005/0215241 A1* | 9/2005 | Okada | 455/414.1 |
| 2005/0255874 A1* | 11/2005 | Stewart-Baxter et al. | 455/550.1 |
| 2006/0105701 A1 | 5/2006 | Cornwell | |
| 2006/0271275 A1* | 11/2006 | Verma | 701/200 |
| 2006/0286930 A1* | 12/2006 | Rathus et al. | 455/26.1 |
| 2007/0032225 A1* | 2/2007 | Konicek et al. | 455/417 |
| 2008/0009296 A1* | 1/2008 | Han | 455/456.4 |
| 2009/0029675 A1* | 1/2009 | Steinmetz et al. | 455/410 |
| 2009/0215387 A1* | 8/2009 | Brennan et al. | 455/1 |
| 2010/0007463 A1* | 1/2010 | Dingman et al. | 340/5.72 |
| 2010/0134266 A1* | 6/2010 | Breiner | 340/439 |
| 2010/0279626 A1* | 11/2010 | Bradley et al. | 455/69 |
| 2011/0021234 A1* | 1/2011 | Tibbitts et al. | 455/517 |

* cited by examiner

SYSTEM FOR CONTROLLING THE USE OF ELECTRONIC DEVICES WITHIN AN AUTOMOBILE

This application claims the benefit of U.S. Provisional Patent Application Ser. No. 60/996,498, filed Nov. 20, 2007, entitled "SYSTEM FOR CONTROLLING THE USE OF ELECTRONIC DEVICES WITHIN AN AUTOMOBILE".

BACKGROUND OF THE INVENTION

1. Field of the Invention

The invention relates to mobile entertainment systems. More particularly, the invention relates to portable entertainment systems adapted for use in vehicles.

2. Description of the Related Art

As the proliferation in the use of electronic devices within automobile continues, concerns relating to the interaction these electronic devices may have with the electronic operating components of the automobile have increased. As anyone who has flown on an aircraft will appreciate, when electronic devices are used in the vicinity of complex electronic control and monitoring systems of the aircraft, concerns regarding the interaction of the electronic devices with the electronic control and monitoring systems result in the requirement all electronic devices be turned off during take-off and landing.

A mandate requiring that both drivers and passengers cease using electronic devices within an automobile is certainly not a workable solution to the problem of interactions between electronic devices and the electronic control and monitoring systems of an automobile. As such, a need exists for a solution allowing for the use of electronic devices within an automobile, while also minimizing the potential for undesirable interaction between the electronic device both drivers and passengers commonly use while within an automobile and the electronic control and monitoring systems of the automobile.

SUMMARY OF THE INVENTION

It is, therefore, an object of the present invention to provide a system for controlling the use of electronic devices within an automobile. The system includes a control module integrated into the operation of the automobile, wherein the control module is linked to the electrical system of the automobile and is controlled, monitored and updated via a graphical user interface of the automobiles. The control module includes a mechanism for identifying use of electronic devices within the automobile, determining whether the usage is permitted and preventing usage of the electronic device if it is determined the usage is not permitted.

It is also an object of the present invention to provide a system wherein the electronic devices are portable electronic devices.

It is another object of the present invention to provide a system wherein the control module is integrated into the operation of a computer control center of the automobile.

It is a further object of the present invention to provide a system wherein the control module includes a receiver gathering all signals transmitted within the automobile and a processor to which the gathered signals are forwarded for analysis as to the origin of the signals based upon the signature of the signal.

It is also an object of the present invention to provide a system wherein the control module includes a transmitter issuing a jamming signal preventing future usage of the unauthorized electronic devices.

It is another object of the present invention to provide a system wherein a communication module with an authorized electronic device communicates with the control module to indicate it is an approved electronic device.

It is a further object of the present invention to provide a system wherein the control module includes a signal transmitter transmitting jamming signals.

It is also an object of the present invention to provide a system wherein the means for identifying, determining and preventing includes RFID tags incorporated into authorized electronic devices and an RF receiver forming part of the control module.

It is another object of the present invention to provide a system wherein the control module alters an issued jamming signal such that unauthorized electronic devices are prevented from usage while the authorized electronic devices are permitted to transmit and receive signals.

Other objects, advantages and salient features of the invention will become apparent from the following detailed description, which taken in conjunction with the annexed drawings, discloses a preferred, but non-limiting, embodiment of the subject invention.

DESCRIPTION OF THE PREFERRED EMBODIMENTS

The detailed embodiments of the present invention are disclosed herein. It should be understood, however, that the disclosed embodiments are merely exemplary of the invention, which may be embodied in various forms. Therefore, the details disclosed herein are not to be interpreted as limiting, but merely as a basis for teaching one skilled in the art how to make and/or use the invention.

Figure 1:
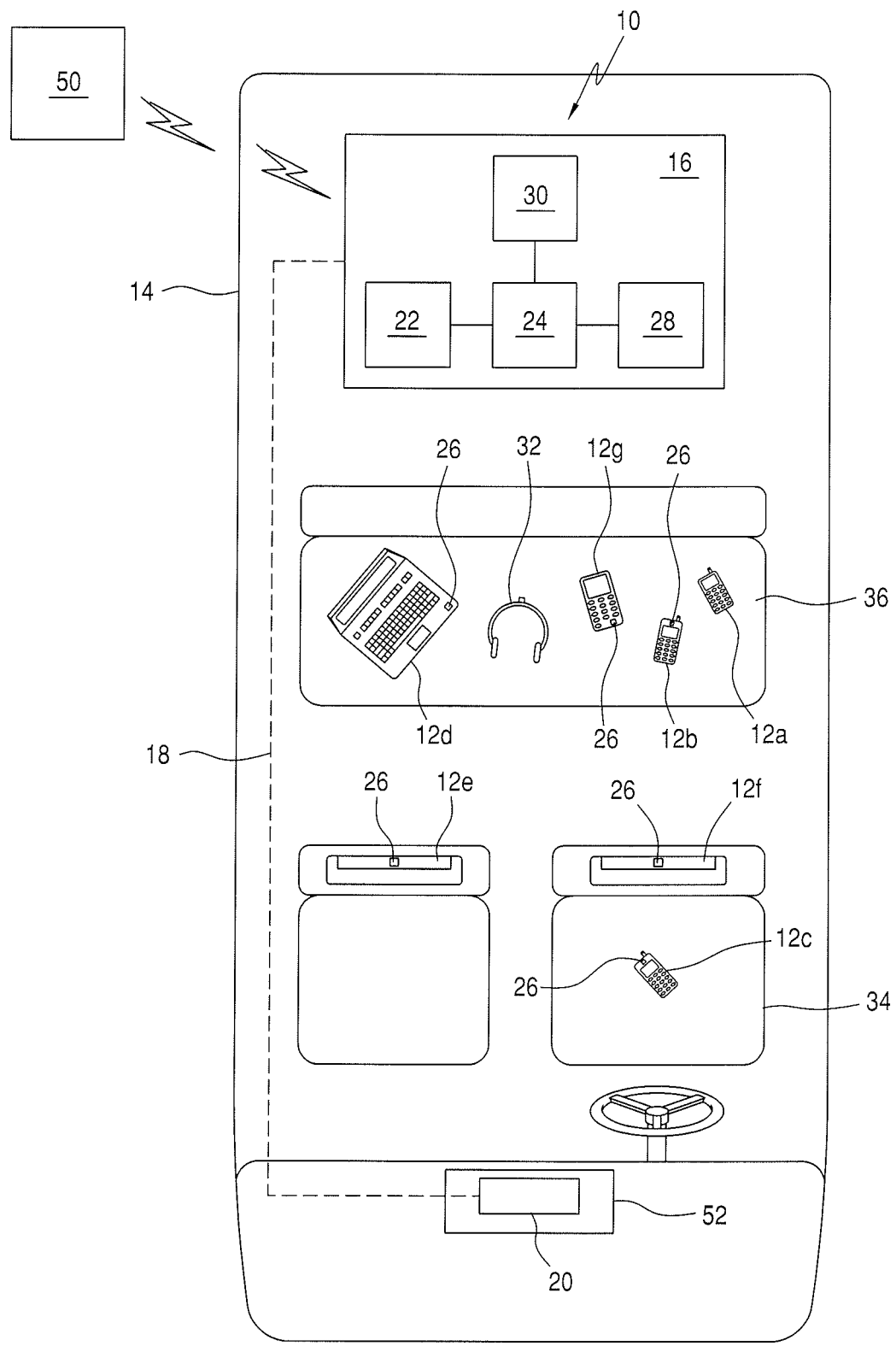
FIG. 1 is a schematic of a first embodiment of the present system.

In accordance with the present invention, and with reference to FIG. 1, a system 10 for controlling the use of portable electronic devices 12a-g within an automobile 14 is disclosed. The present system 10 uses jamming and transmission technology to control the use of electronic devices 12a-g within an automobile 14 so the use of these electronic devices 12a-g does not interfere with the operation of the electrical architecture of the automobile 14. For example, use of the electronic devices 12a-g is limited by the present system 10 so as to ensure proper functioning of wireless electronic automobile systems, such as, drive by wire systems, voice communication systems, advanced warning systems and accident avoidance systems as well as other safety systems which may currently be used in automobiles or be later incorporated into automobiles.

With this in mind, the centerpiece of the present system 10 is a control module 16 integrated into the operation, for example, via the computer control center 52 of the automobile 10. The control module 16 is linked to the electrical system 18 of the automobile 14 and as such may be controlled, monitored and/or updated via a graphical user interface 20 commonly found in automobiles 14. In accordance with a preferred embodiment of the present invention, the control module 16 includes mechanisms for identifying use of electronic devices 12a-g, both portable and fixedly connected to the automobile 14, within an automobile 14, determining whether the usage is permitted and preventing usage of the electronic device 12a-g if it is determined the usage is not permitted. Where usage is determined as being permitted, the electronic device 12a-g will not interfere with the electronic signals controlling the built-in devices of the automobile.

More particularly, the control module 16 includes a receiver 22 gathering some or all signals being transmitted within the automobile 14 The signals are forwarded to a processor 24 of the control module 16 that then analyzes the origin of the signals based upon the signature of the signal. Once control module 16 identifies the electronic devices 12a-g associated with the various signals, the control module 16 determines which are unauthorized electronic devices 12a and issues a jamming signal preventing future usage of the unauthorized electronic devices 12a.

The control module 16 permits usage of authorized (or approved) electronic devices 12b-g within an automobile 14. These authorized electronic devices 12b-g comply with pre-established requirements allowing them to be used within the automobile 14 and accept override controls by the control module 16 to ensure safe usage thereof. With that in mind, and in accordance with a preferred embodiment of the present invention, the authorized electronic devices 12b-g are provided with a communication module 26 specifically designed to link with and communicate with the control module 16. As those skilled in the art will certainly appreciate, the communication module 26 is added to the electronic device 12b-g in addition to the basic functional components of the electronic device 12b-g allowing the electronic device 12b-g to function for its intended purpose. For example, a cellular telephone 12a, 12b, 12c will still include the basic components allowing for wireless communication via a cellular network, a laptop 12d will still include components allowing for wireless broadband communication, and an entertainment system (for example a headrest mounted mobile video system) 12e, 12f will still include components for permitting the projection of audio/video content for viewing within the automobile 14.

By incorporating the communication module 26 within the authorized electronic device 12b-g a certain level of control over the electronic device 12b-g is granted to the control module 16. As a result, where safety issues or automobile operation issues dictate, the control module 16, via a transmitter 28 linked to the processor 24, will alter the functioning of the electronic device 12b-g to ensure it does not interfere with the proper operation of the automobile 14. For example, if the control module 16 finds that an authorized cellular telephone 12b, 12c is being used within the automobile 14 in a manner detrimental to the operation of the automobile 14, the cellular telephone 12b, 12c will be turned off via the transmitter 28 of the control module 16 sending a signal overriding operation thereof via communication with the communication module 26 embedded within the cellular telephone 12b, 12c. Similarly, if the control module 16 identifies that wireless headphone 32 signals being issued by an automobile entertainment system 12e, 12f might interfere with operation of the automobile 14, the automobile entertainment system 12e, 12f would likely be shut down via a command signal issued from the transmitter 28 of the control module 16 to the entertainment system 12e, 12f via the embedded communication module 26.

It is contemplated the ability of the control module 16 to enhance automobile safety will be improved by identifying where the authorized electronic devices 12b-g are located within the automobile 14. With this in mind, the control module 16 includes a position sensing component 30 which utilizes the communication module 26 of the authorized electronic device 12b-g to determine where the authorized electronic device 12b-g is positioned within the automobile 14. As a result, a cellular telephone 12c located in the vicinity of the driver's seat 34 would be inactivated or completely turned off to prevent the driver from using the cellular telephone 12c while driving, while a cellular telephone 12b located in the backseat 36 of the automobile 14 would be permitted to function in a conventional manner. Similarly, one may be permitted to utilize an authorized laptop 12d within the backseat 36 of an automobile 14, but be prevented from using the laptop 12d when it is positioned within the vicinity of the driver's seat 34 of the automobile 14. In addition, an authorized laptop 12d would be permitted to use wireless transmission protocols while an unauthorized laptop would be jammed and, prevent use of wireless protocols.

It is contemplated the control module 16 could further be configured to allow certain functionalities of an authorized electronic device 12b-g while preventing other functionalities from being utilized. For example, the control module 16 might prevent a laptop 12d, personal digital assistant 12g or cellular telephone 12b, 12c from transmitting or receiving data while permitting voice information to be transmitted and received. The control module 16 might allow cellular telephone 12b, 12c to operate when use of a Bluetooth earpiece is detected, but prevent usage of the cellular telephone 12b, 12c when it is apparent to the control module 16 a hands-free mechanism is not being utilized in conjunction with the cellular telephone.

It is contemplated users may desire to update the devices authorized for use in accordance with the present invention. As such, and with reference to FIG. 1, the control module 16 includes a mechanism for linking with a central control facility 50. In accordance with a preferred embodiment, the linking mechanism is a wireless protocol, for example, Wi-Fi, cellular, etc., linking to the central control facility 50 via the Internet or another global communication network. Once linked to the central control facility 50 appropriate updates would be downloaded directly to the control module 16 updating the control module's 16 list of authorized electronics devices approved for use in accordance with the present invention.

Figure 2:
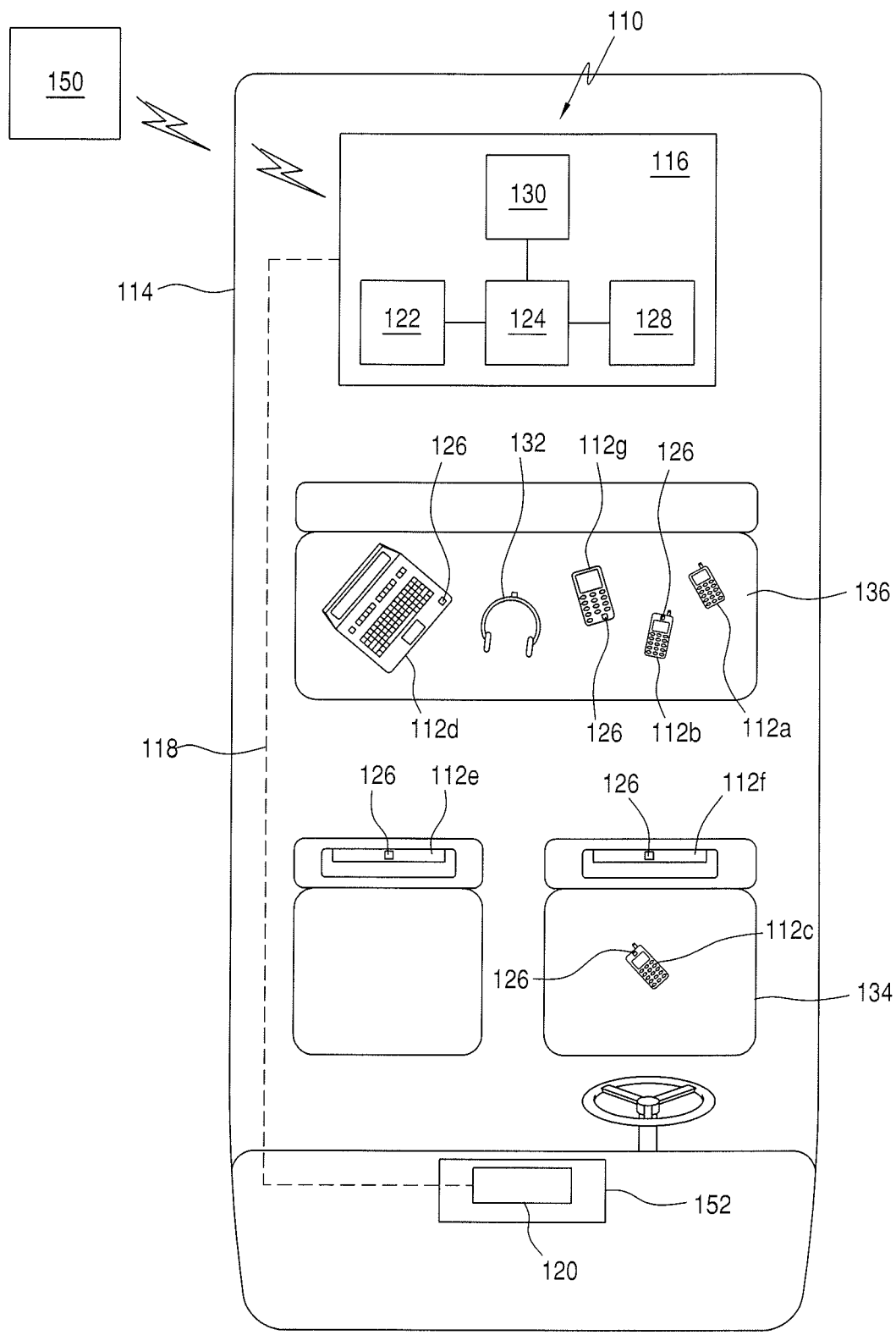
FIG. 2 is a schematic in accordance with an alternate embodiment of the present system.

In accordance with an alternate embodiment as disclosed with reference to FIG. 2, the system 110 is a control module 116 integrated into the operation, for example, via the computer control center 152 of the automobile 114 as with the previous embodiment. The control module 116 is linked to the electrical system 118 of the automobile 114 and as such may be controlled, monitored and/or updated via a graphical user interface 120 commonly found in automobiles 114. In accordance with a preferred embodiment of the present invention, the control module 116 includes mechanisms for identifying use of authorized (or approved) electronic devices 112b-g, both portable and fixedly connected to the automobile 114, within an automobile 114, determining whether the usage is permitted, that is, whether it is an authorized electronic device 112b-g or whether it is an unauthorized electronic device 112a, and preventing usage of the electronic device 112a-g if it is determined the usage is not permitted. Where usage is determined as being permitted, the electronic device 112b-g will not interfere with the electronic signals controlling the built-in devices of the automobile 114.

More particularly, the control module 116 includes a signal transmitter 128 that is designed to transmit jamming signals for all known electronic devices which may be utilized within an automobile 114. Authorized electronic devices 112b-g are provided with RFID (radio frequency identification) tags 126 transmitting identification signals to a RF receiver 122 of the control module 116. The signals are forwarded to a processor 124 of the control module 116 that then analyzes the identification codes issued by the RFID tags 126 of authorized electronic devices 112*b-g*. Based upon the RFID signals received by the control module 116, the control module 116 determines which authorized electronic devices 112*b-g* are within the automobile 114 and alters the issued jamming signal such that the unauthorized electronic devices 112*a* is prevented from usage while the authorized electronic devices 112*b-g* are permitted to transmit and receive signals.

As with the prior embodiment, it is contemplated the ability of the control module 116 to enhance automobile safety will be improved by identifying where the authorized electronic devices 112*b-g* are located within the automobile 114. With this in mind, the control module 116 includes a position sensing component 130 which utilizes the RFID tag 126 of the authorized electronic device 112*b-g* to determine where the authorized electronic device 112*b-g* is positioned within the automobile 114. As a result, a cellular telephone 112*c* located in the vicinity of the driver's seat 134 would be effectively inactivated by the transmission of a jamming signal to prevent the driver from using the cellular telephone 112*c* while driving, while a cellular telephone 112*b* located in the backseat 136 of the automobile 114 would be permitted to function in a conventional manner. Similarly, one may be permitted to utilize wireless transmission protocols in conjunction with an authorized laptop 112*d* within the backseat 136 of an automobile 114, but be prevented from using wireless transmission protocols in conjunction with the laptop 112*d* when it is positioned within the vicinity of the driver's seat 134 of the automobile 114.

It is contemplated the control module 116 could further be configured to allow certain functionalities of an authorized electronic device 112*b-g* while preventing other functionalities from being utilized. For example, the control module 116 might prevent a laptop 112*d*, personal digital assistant 112*g* or cellular telephone 112*b*, 112*c* from transmitting or receiving data while permitting voice information to be transmitted and received. The control module 116 might allow cellular telephone 112*b*, 112*c* to operate when use of a Bluetooth earpiece is detected, but prevent usage of the cellular telephone 112*b*, 112*c* when it is apparent to the control module 116 a hands-free mechanism is not being utilized in conjunction with the cellular telephone.

It is contemplated users may desire to update the devices authorized for use in accordance with the present invention. As such, and with reference to FIG. 2, the control module 116 includes a mechanism for linking with a central control facility 150. In accordance with a preferred embodiment, the linking mechanism is a wireless protocol, for example, Wi-Fi, cellular, etc., linking to the central control facility 150 via the Internet or another global communication network. Once linked to the central control facility appropriate updates would be downloaded directly to the control module 116 updating the control module's 116 list of authorized electronics devices approved for use in accordance with the present invention.

While the preferred embodiments have been shown and described, it will be understood that there is no intent to limit the invention by such disclosure, but rather, is intended to cover all modifications and alternate constructions falling within the spirit and scope of the invention.

The invention claimed is:
1. A system for controlling the use of an electronic device within a vehicle, comprising:
a control module integrated into operation of the vehicle, wherein the control module is linked to an electrical system of the vehicle and is controlled, monitored and updated via a graphical user interface of the vehicle; and
a position sensing component disposed in the control module, wherein the position sensing component is configured to determine a location of the electronic device relative to the vehicle,
wherein the control module is configured to identify a current use of the electronic device, determine whether the current use of the electronic device is a permitted use or a non-permitted use, and determine whether the electronic device is an authorized device or an unauthorized device, and
the control module is further configured allow or prevent the current use of the electronic device based on the location of the electronic device relative to the automobile based on the location of the electronic device relative to the vehicle, the determination of whether the electronic device is an authorized device or an unauthorized device, and the determination of whether the current use of the electronic device is a permitted use or a non-permitted use.

2. The system according to claim 1, wherein the electronic device is a portable electronic device.

3. The system according to claim 1, wherein the control module is integrated into the operation of a computer control center of the vehicle.

4. The system according to claim 1, wherein the control module includes a receiver gathering all signals transmitted within the vehicle and a processor to which gathered signals are forwarded for analysis as to the origin of the signals based upon the signature of the signal.

5. The system according to claim 4, wherein the control module includes a transmitter issuing a jamming signal preventing future usage of unauthorized electronic devices, while permitting future usage of authorized electronic devices.

6. The system according to claim 1, further comprising a communication module disposed in an authorized electronic device, wherein the communication module is configured to communicate with the control module to indicate that it is an authorized electronic device without communicating with the network external to the vehicle, and the position sensing component is configured to determine a location of the authorized electronic device relative to the vehicle via the communication module.

7. The system according to claim 1, wherein the control module includes a signal transmitter transmitting jamming signals.

8. The system according to claim 7, further comprising:
a radio frequency identification (RFID) receiver disposed in the control module; and
an RFID tag disposed in an authorized electronic device, wherein the control module is configured to identify the authorized electronic device using the RFID reader and the RFID tag without communicating with the network external to the vehicle.

9. The system according to claim 8, wherein the control module is configured to alter an issued jamming signal such that unauthorized electronic devices are prevented from usage while the authorized electronic device is permitted to transmit and receive signals.

10. The system according to claim 1, wherein use of the electronic device is not permitted when the location of the electronic device is determined to be within a vicinity of a driver's seat.

11. The system according to claim 1, further comprising:
a linking mechanism disposed in the control module and in communication with a remote computer, wherein the linking mechanism is configured to download an update for the control module from the remote computer.

12. The system according to claim 11, wherein the update includes an updated list of authorized electronic devices.

* * * * *